United States Patent
Jiang et al.

(10) Patent No.: US 11,616,475 B2
(45) Date of Patent: Mar. 28, 2023

(54) AMPLIFIER GAIN-TUNING CIRCUITS AND METHODS

(71) Applicant: pSemi Corporation, San Diego, CA (US)

(72) Inventors: Rong Jiang, San Diego, CA (US); Khushali Shah, San Diego, CA (US); Ravindranath D. Shrivastava, San Diego, CA (US); Parvez Daruwalla, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 17/141,726

(22) Filed: Jan. 5, 2021

(65) Prior Publication Data
US 2022/0216833 A1    Jul. 7, 2022

(51) Int. Cl.
*H03F 1/26* (2006.01)
*H03F 3/72* (2006.01)
*H03G 1/00* (2006.01)

(52) U.S. Cl.
CPC .................. *H03F 1/26* (2013.01); *H03F 3/72* (2013.01); *H03G 1/0088* (2013.01); *H03F 2200/294* (2013.01); *H03F 2200/372* (2013.01); *H03F 2203/7239* (2013.01)

(58) Field of Classification Search
CPC ........ H03F 1/26; H03F 3/72; H03F 2200/294; H03F 2200/372; H03F 2203/7239; H03G 1/0088
USPC .................................... 330/141, 296, 311, 51
See application file for complete search history.

(56) References Cited

U.S. PATENT DOCUMENTS

| | | | | |
|---|---|---|---|---|
| 6,522,195 | B2 * | 2/2003 | Watanabe | H03F 3/1935 330/51 |
| 8,346,179 | B2 * | 1/2013 | Brunn | H03F 3/45188 455/88 |
| 8,378,748 | B2 * | 2/2013 | Heikkinen | H03F 1/26 330/51 |
| 2003/0231055 | A1 * | 12/2003 | Macedo | H03F 1/302 330/51 |
| 2018/0091099 | A1 * | 3/2018 | Kobayashi | H03F 1/56 |

* cited by examiner

*Primary Examiner* — Hafizur Rahman
*Assistant Examiner* — Khiem D Nguyen
(74) *Attorney, Agent, or Firm* — Jaquez Land Greenhaus & McFarland LLP; John Land, Esq.

(57) ABSTRACT

Circuits and methods for improving the noise figure (NF) of an amplifier, particularly an LNA, in high-gain modes while improving the IIP3 of the amplifier in low-gain modes. The source of an amplifier common-source FET is coupled to circuit ground thorough a degeneration circuit comprising a two-port inductor and a bypass switch coupled in parallel with the inductor. A switched feedback circuit is coupled between the gate of the common-source FET and a feedback node in the amplifier output signal path. During a low gain mode, the inductor is entirely bypassed and the enabled feedback circuit lowers the input impedance of the common-source FET and reduces the gain of the amplifier circuit, essentially eliminating the need for a degeneration inductor. During a high gain mode, the source of the common-source FET is coupled to circuit ground through the inductor and the feedback circuit is disabled. Other gain modes are supported.

21 Claims, 8 Drawing Sheets

AMPLIFIER GAIN-TUNING CIRCUITS AND METHODS

BACKGROUND

(1) Technical Field

The invention relates to electronic circuits, and more particularly to radio frequency amplifier circuits.

(2) Background

Many modern electronic systems include radio frequency (RF) receivers; examples include personal computers, tablet computers, wireless network components, televisions, cable system "set top" boxes, radar systems, and cellular telephones. Many RF receivers are paired with RF transmitters in the form of transceivers, which often are quite complex two-way radios. In some cases, RF transceivers are capable of transmitting and receiving across multiple frequencies in multiple bands.

Amplifiers are a common component in RF transmitters and receivers, and are frequently used for power amplification of transmitted RF signals and for low-noise amplification of received RF signals. For many RF systems, particularly those requiring low power and/or portability (e.g., cellular telephones, WiFi-connected computers, cameras, and other devices, etc.), it has become common to use complementary metal-oxide semiconductor (CMOS) fabrication technology to create low cost, low power, complex integrated circuits (ICs). CMOS devices include bulk CMOS, silicon-on-insulator (SOI) CMOS, and silicon-on-sapphire (SOS) CMOS (SOS being a type of SOI fabrication technology).

FIG. 1 is a simplified schematic diagram of a generalized embodiment of a prior art low-noise amplifier (LNA) circuit 100. The LNA circuit 100 includes a stack of two serially-connected FETs $M_{CS}$, $M_{CG}$ in a cascode arrangement. An RF input signal, $RF_{IN}$, which may be passed through an impedance matching circuit 102, is coupled to the gate of the common-source lower FET $M_{CS}$. The impedance matching circuit 102 may be simply a series-connected capacitor and inductor, but may alternatively comprise more complex impedance matching networks known in the art.

The source of the $M_{CS}$ is coupled thorough a degeneration inductor $L_{DEG}$ to circuit ground. The source of the common-gate upper FET $M_{CG}$ is coupled to the drain of $M_{CS}$, and the drain of $M_{CG}$ provides an amplified RF output signal, $RF_{OUT}$, coupled through a DC blocking capacitor C. The capacitor C may also provide output matching, and in some embodiments may be settable (e.g., during manufacture) or adjustable (e.g., when assembled in a circuit module) or programmable. In practical circuits, in order to overcome a relatively low breakdown voltage per CMOS FET, multiple common-gate FETS may be series-coupled or "stacked" above FET $M_{CG}$ so that the total RF voltage swing occurring across the LNA circuit 100 is distributed over the stacked CMOS devices. The output of the LNA circuit 100 would then generally be taken from the drain of the upper-most common-gate FET in the stack.

A load matching and bias feed circuit 104 is connected between a source voltage $V_{DD}$ and the drain of $M_{CG}$. The load matching and bias feed circuit 104 may comprise, for example, an inductor, and optionally may include a resistor and/or a capacitor coupled in parallel with the inductor.

A bias circuit 106 is configured to provide a suitable bias voltage CG_Vbias to the common-gate FET $M_{CG}$ and a suitable bias voltage CS_Vbias to the common-source FET $M_{CS}$, in known fashion. Additional well-known circuit elements that might be included in some applications, such as DC block capacitors, output impedance matching circuitry, and additional filters, are omitted for clarity.

The degeneration inductor $L_{DEG}$ performs several functions, including obtaining a good dynamic range (e.g., a good noise figure NF), achieving high sensitivity with low power consumption, and helping with input impedance matching. In order to provide for more than one gain mode (e.g., at least a low gain mode and a high gain mode), a conventional degeneration inductor $L_{DEG}$ may be implemented as a multiple-port coil. For example, FIG. 2 is a stylized diagram of a prior art integrated circuit inductor coil 200. The inductor coil 200 has an input port IN, and three output ports OUT1, OUT2, and OUT3. Any one of the output ports may be connected to other circuit elements (including circuit ground) by means of a corresponding coupling switch (not shown), and each port presents a different inductance value. Thus, if the degeneration inductor $L_{DEG}$ in FIG. 1 is implemented like the inductor coil 200, switches Sw1 or Sw2 can selectively connect a particular output port (e.g., OUT2 or OUT3) of the inductor coil 200 to circuit ground, thereby selecting a corresponding inductance value for the degeneration inductor $L_{DE}G$. If switches Sw1 and Sw2 are both open, then the degeneration inductor $L_{DEG}$ has an inductance value corresponding to the entire inductor coil 200.

Two important design parameters for LNAs are noise figure (NF) and input-referenced third intercept point (IIP3). NF is a measure of degradation of the signal-to-noise ratio (SNR) caused by components in a signal chain, with lower values indicating better performance. IIP3 is a figure of merit representing amplifier linearity, with higher values indicating better performance. In general, NF has a stricter specification requirement in high-gain modes than in low gain-modes, while IIp3 has a stricter specification requirement in low-gain modes than in high-gain modes.

In an LNA architecture, improving NF in a high-gain mode while improving IIP3 in a low-gain mode is a desirable goal. The present invention provides circuits and methods for accomplishing that goal and while also applying to other types of amplifiers.

SUMMARY

The present invention encompasses circuits and methods for improving the noise figure (NF) of a low-noise amplifier (LNA) in a high-gain mode while improving the input-referenced third intercept point (IIP3) of the LNA in a low-gain mode. Embodiments of the invention provide a novel gain switching architecture for an LNA that can achieve input impedance matching with or without a degeneration inductor enabled. The inventive circuits and methods may also be applied to other types of amplifiers, such as power amplifiers, for gain reduction, input impedance matching and linearity improvement.

Some embodiments of the present invention include an amplifier, particularly an LNA, with two important circuit improvements that may be used in combination to achieve a better NF in a high-gain mode and a better IIP3 in a low-gain mode. First, the source of an amplifier common-source FET is coupled to circuit ground thorough a degeneration circuit comprising a simple two-port degeneration inductor and a bypass switch coupled in parallel with the degeneration inductor. Second, a switched feedback circuit is coupled between the gate of the common-source FET and a feedback node in the amplifier output signal path.

During operation in a low gain mode, in which IIP3 is generally the more important parameter to emphasize, the bypass switch is set to a closed state, thereby coupling the source of the common-source FET to circuit ground and bypassing the degeneration inductor entirely. Concurrently, the feedback switch is closed, which enables the feedback circuit. The feedback circuit lowers the input impedance of the common-source FET and reduces the gain of the amplifier circuit, essentially eliminating the need for a degeneration inductor.

During operation in a high gain mode, in which NF is generally the more important parameter to emphasize, the bypass switch is set to an open state, thereby coupling the source of the common-source FET to circuit ground through the degeneration inductor. Concurrently, the feedback switch is opened, disabling the feedback circuit. In this mode of operation, the presence of the degeneration inductor helps provide a good noise figure NF, achieves high sensitivity with low power consumption, and helps with impedance matching at the input of the common-source FET.

Gain modes between the highest and lowest gain modes may be supported in which the switch states of the feedback switch and the bypass switch may not coincide.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION

The present invention encompasses circuits and methods for improving the noise figure (NF) of a low-noise amplifier (LNA) in a high-gain mode while improving the input-referenced third intercept point (IIP3) of the LNA in a low-gain mode. Embodiments of the invention provide a novel gain switching architecture for an LNA that can achieve input impedance matching with or without a degeneration inductor enabled. The inventive circuits and methods may also be applied to other types of amplifiers, such as power amplifiers, for gain reduction, input impedance matching and linearity improvement.

Figure 3A:
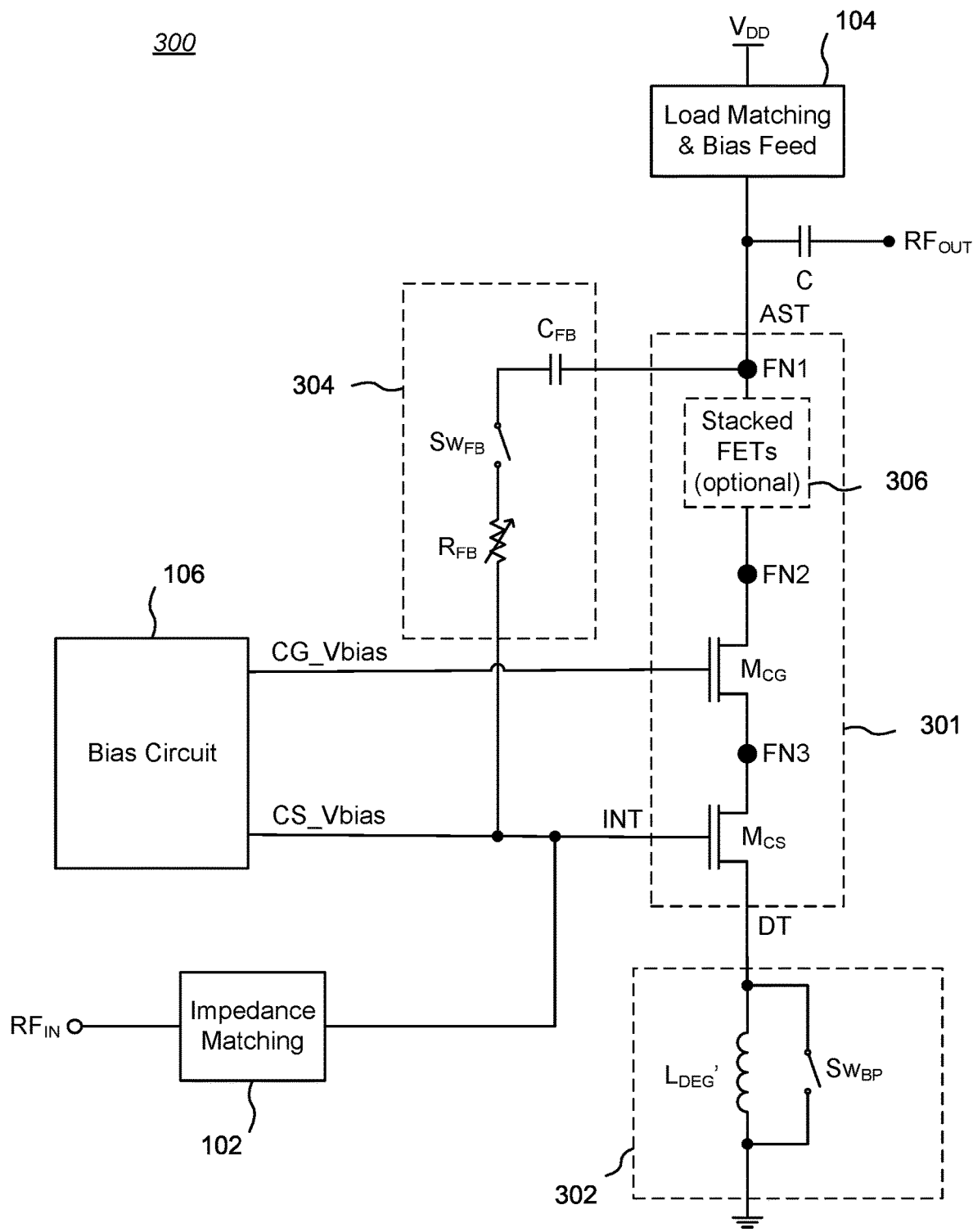
FIG. 3A is a simplified schematic diagram of a generalized embodiment of a low-noise amplifier (LNA) circuit in accordance with the present invention.

FIG. 3A is a simplified schematic diagram of a generalized embodiment of a low-noise amplifier (LNA) circuit 300 in accordance with the present invention. The LNA circuit 300 of FIG. 3A is similar in many aspects to the LNA circuit 100 of FIG. 1. More generally, an amplification core 301 includes the common-source FET $M_{CS}$ and the common-gate FET $M_{CG}$. Accordingly, the gate of the common-source FET $M_{CS}$ may be regarded as an input terminal INT of the amplification core 301, the source of the common-source FET $M_{CS}$ may be regarded as a degeneration terminal DT of the amplification core 301, and the drain of the common-gate FET $M_{CG}$ may be regarded as an amplified-signal terminal AST of the amplification core 301. As noted above, in practical circuits, in order to overcome a relatively low breakdown voltage per CMOS FET, multiple common-gate FETS may be series-coupled in a FET stack 306 between the drain of the bottom-most common-gate FET $M_{CG}$ and the amplified-signal terminal AST—that is, the amplification core 301 may have multiple series-coupled common-gate FETs in a cascode configuration. The amplified-signal terminal AST would then be the drain of the upper-most common-gate FET in the amplification core 301.

Figure 1:
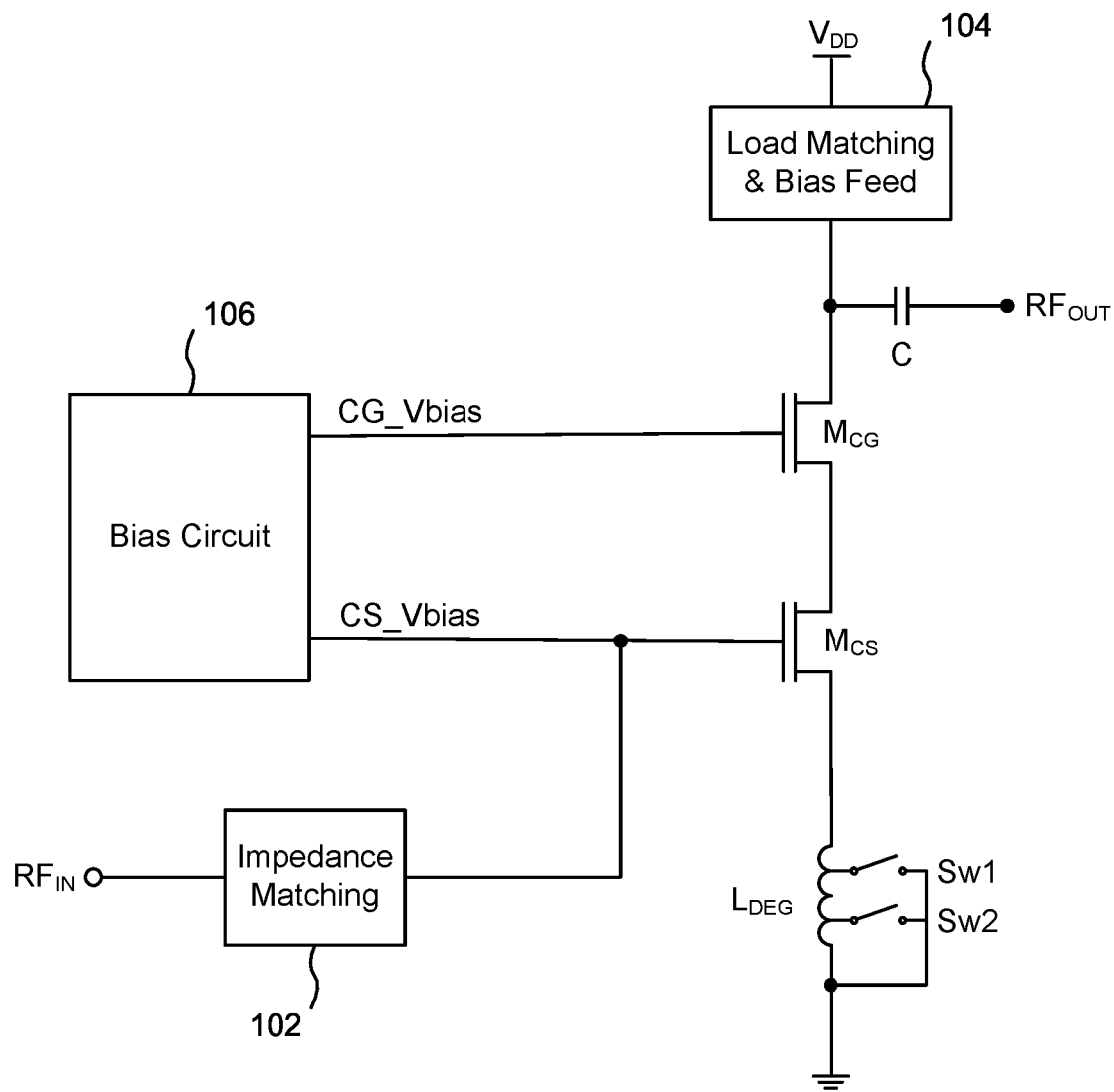
FIG. 1 is a simplified schematic diagram of a generalized embodiment of a prior art low-noise amplifier (LNA) circuit.

The LNA circuit 300 of FIG. 3A has two important circuit improvements compared to the LNA circuit 100 of FIG. 1 that may be used in combination to achieve a better NF in a high-gain mode and a better IIP3 in a low-gain mode.

First, the source of the FET $M_{CS}$ (the degeneration terminal DT) is coupled to circuit ground thorough a degeneration circuit 302 comprising a simple two-port degeneration inductor $L_{DEG}'$ and a bypass switch Swim, coupled in parallel with the degeneration inductor $L_{DEG}'$.

Second, a feedback circuit 304 is coupled between the gate of the common-source FET $M_{CS}$ (input terminal INT) and a feedback node in the amplifier output signal path. More specifically, a feedback node may be located at the drain of a selected one of the FETs in the amplification core 301. In the illustrated embodiment, one terminal of the feedback circuit 304 is coupled to the drain of the upper-most FET in the FET stack 306 at feedback node FN1. In alternative embodiments, the feedback circuit 304 may be connected, for example, at feedback node FN2 (the drain of the bottom-most common-gate FET $M_{CG}$) or at feedback node FN3 (the drain of the common-source FET $M_{CS}$). The choice of feedback node for connection to the feedback circuit 304 may be made, for example, based on different desired feedback strength and different desired input impedance.

In the example shown in FIG. 3A, the feedback circuit 304 comprises a capacitor $C_{FB}$ series-coupled to a feedback switch $Sw_{FB}$, which in turn is series-coupled to a resistor $R_{FB}$. The capacitor $C_{FB}$, the feedback switch $Sw_{FB}$, and the resistor $R_{FB}$ may be connected in any series order in other embodiments. The resistor $R_{FB}$ is preferably a variable resistor having a resistance value that may be dynamically programmed during field operation, or which is settable during fabrication or factory testing, or in the field (e.g., by burning or "blowing" fusible links). The capacitor $C_{FB}$ provides DC blocking functionality, and operates in conjunction with the resistor $R_{FB}$ as a filter. In some embodiments, the capacitor $C_{FB}$ may be a variable capacitor. Accordingly, in a preferred embodiment, the feedback circuit 304 is tunable.

Figure 3B:
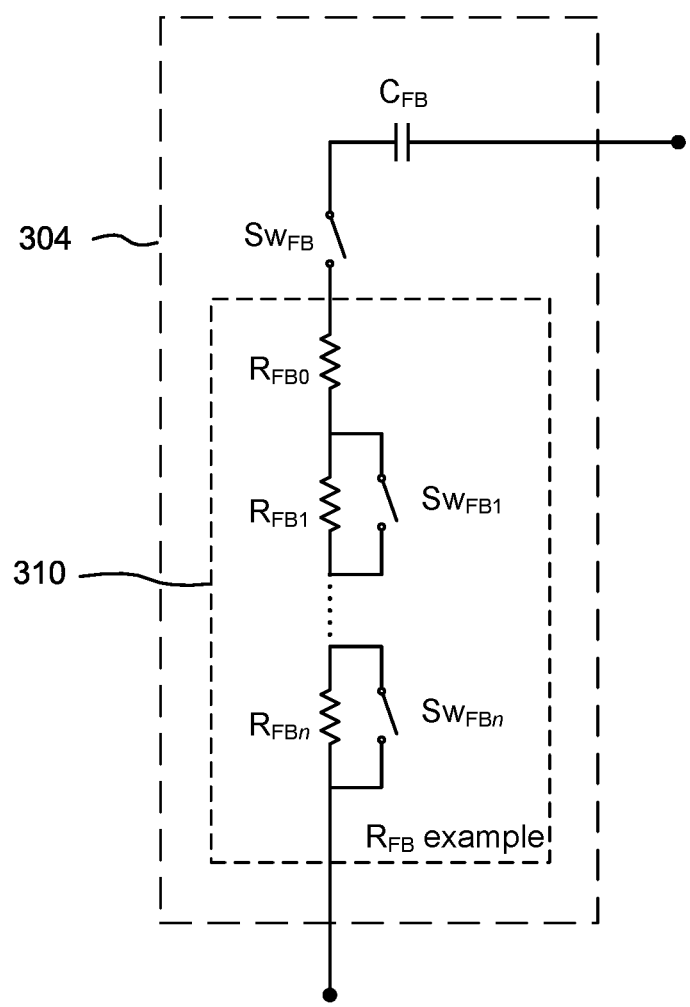
FIG. 3B is a schematic diagram of one embodiment of an alternative feedback circuit that may be used in the circuit of FIG. 3A.

FIG. 3B is a schematic diagram 320 of one embodiment of an alternative feedback circuit 304 that may be used in the circuit of FIG. 3A. The capacitor $C_{FB}$ and the feedback switch $Sw_{FB}$ are series-coupled to an example embodiment of the resistor $R_{FB}$ of FIG. 3A comprising a multi-state resistance block 310. The multi-state resistance block 310 includes a non-switchable resistor $R_{FB0}$ that provides a minimum resistance series-coupled to the capacitor $C_{FB}$ and the feedback switch $Sw_{FB}$ (again, in any series order). One or more additional resistors $R_{FB1}$-$R_{FBn}$ may be coupled in series with the non-switchable resistor $R_{FB0}$ by opening corresponding parallel switches $Sw_{FB1}$-$Sw_{FBn}$, thus providing a selectable amount of additional resistance values.

An advantage of using a variable or multi-state resistor $R_{FB}$ is that multiple resistance values in the feedback circuit 304 enable multiple gain modes. For example, low-noise amplifiers in mobile RF receiver devices need multiple gain modes depending upon the range of input signal strength at the receiver. In addition, enabling multiple gain modes by using a variable or multi-state resistor $R_{FB}$ eliminates the need for an output attenuator (common in conventional receiver LNAs).

The bypass switch $Sw_{BP}$, the feedback switch $Sw_{FB}$, and the switches $Sw_{FB1}$-$Sw_{FBn}$ may be implemented as FETs, particularly MOSFETs. The modes of operation of the LNA circuit 300 may be set by a control circuit (not shown) in known fashion. Thus, for example, a control circuit may connect to the bypass switch $Sw_{BP}$ and to the feedback switch $Sw_{FB}$ with a common signal conductor, since both switches are generally concurrently switched to the same state (see TABLE 1 below). However, in some embodiments, the control circuit may switch the bypass switch $Sw_{BP}$ and the feedback switch $Sw_{FB}$ independently. The control circuit may also connect to the resistor $R_{FB}$ to selected different resistance values for different gain states, for example, by opening or closing one or more of the switches $Sw_{FB1}$-$Sw_{FBn}$. Similarly, the control circuit may connect to the capacitor $C_{FB}$ (if variable) to selected different capacitance values for different gain states, for example, to help input impedance matching.

During operation in a low-gain mode, in which IIP3 is generally the more important parameter to emphasize, the bypass switch $Sw_{BP}$ is generally set to a closed state, thereby coupling the source of the FET $M_{CS}$ (the degeneration terminal DT) to circuit ground and bypassing the degeneration inductor '$L_{DEG}$' entirely. Concurrently, the feedback switch $Sw_{FB}$ is closed, which enables the feedback circuit 304. The feedback circuit 304 lowers the input impedance of the FET $M_{CS}$ and reduces the gain of the LNA circuit 300, essentially eliminating the need for a degeneration inductor. In embodiments having multiple low-gain modes, the resistance of the resistor $R_{FB}$ and/or the capacitance of the capacitor $C_{FB}$ may be programmatically varied to tune the feedback circuit 304 to better match the gain level and/or input impedance matching.

During operation in a high-gain mode, in which NF is generally the more important parameter to emphasize, the bypass switch $Sw_{BP}$ is set to an open state, thereby coupling the source of the FET $M_{CS}$ (the degeneration terminal DT) to circuit ground through the degeneration inductor '$L_{DEG}$'; that is, the degeneration inductor '$L_{DEG}$' is in the signal path from the FET $M_{CS}$ to circuit ground. Concurrently, the feedback switch $Sw_{FB}$ is opened, disabling the feedback circuit 304. In this mode of operation, the presence of the degeneration inductor '$L_{DEG}$' helps provide a good noise figure NF, achieves high sensitivity with low power consumption, and helps with impedance matching at the input of the FET $M_{CS}$ (input terminal INT).

The operational states of the switches in the degeneration circuit 302 and the feedback circuit 304 as described above are summarized in TABLE 1 below, which assumes only two gain modes and that a value of R1 is assigned to resistor $R_{FB}$ in the lowest gain mode to match the selected gain level and input impedance.

TABLE 1

| Switch | Highest-gain Mode Switch State | Lowest-gain Mode Switch State |
| --- | --- | --- |
| $Sw_{FB}$ | Open | Closed |
| $Sw_{BP}$ | Open | Closed |
| $R_{FB}$ | n/a | R1 |

In some embodiments, the LNA circuit 300 may have multiple high-gain and low-gain modes and the states of the bypass switch $Sw_{BP}$ and the feedback switch $Sw_{FB}$, along with the resistance setting for the resistor $R_{FB}$, may be independently controlled to provide the best IIP3 and NF performance for a selected gain mode. For example, TABLE 2 below shows four gain modes. For the highest and lowest gain modes, the switch settings of TABLE 1 still apply. However, for example, for a particular high-gain mode (not the highest gain mode), the feedback switch $Sw_{FB}$ may be closed, the bypass switch $Sw_{BP}$ may be open, and a value of R3 may be assigned to resistor $R_{FB}$ to match the selected gain level and input impedance.

Similarly, in a particular low-gain mode (not the lowest gain mode), the feedback switch $Sw_{FB}$ may be closed, the bypass switch $Sw_{BP}$ may be open, and a value of R2 may be assigned to resistor $R_{FB}$ to match the selected gain level and input impedance. In general, the resistance values would be set such that R3>R2>R1.

Thus, gain modes between the highest and lowest gain modes may be supported in which the switch states of the feedback switch $Sw_{FB}$ and the bypass switch $Sw_{BP}$ may not coincide, with the value of resistor $R_{FB}$ providing another control variable.

TABLE 2

| Switch | High-gain Mode Switch States | | Low-gain Mode Switch States | |
| --- | --- | --- | --- | --- |
| $Sw_{BP}$ | Open | | Open | Closed |
| $Sw_{FB}$ | Open | Closed | | Closed |
| $R_{FB}$ | n/a | R3 | R2 | R1 |

Yet another control variable is mode-dependent input impedance matching. Impedance matching at the input terminal INT of the amplification core 301 is a function of the feedback resistor $R_{FB}$ and the bias condition of the amplification core 301. A particular resistance setting for the feedback resistor $R_{FB}$ and appropriate voltage levels for CG_Vbias and CS_Vbias can be selected to make sure the gain level and the input impedance matching for the amplification core 301 meets required specifications for particular gain modes. The selected resistance settings and corresponding bias voltage levels for particular gain modes may be, for example, stored in a look-up table in the control circuit for the amplifier.

While TABLES 1 and 2 show specific switch and resistance states for example gain modes, it should be appreciated that the inventive architecture provides a great deal of flexibility in setting amplifier circuit component values and component states in order to achieve a variety of performance goals. For example, it may be that noise factor and input impedance matching in a maximum gain mode are to be emphasized. In that case, the degeneration inductor $L_{DEG}'$ generally should not be bypassed (by opening the bypass switch $Sw_{BP}$) and the feedback circuit 304 should be disabled (by opening the feedback switch $Sw_{FB}$).

In other cases, it may be that linearity (IIP3) in a maximum gain mode is to be emphasized. In that case, the degeneration inductor $L_{DEG}'$ generally should be bypassed (by closing the bypass switch $Sw_{BP}$) and the feedback circuit 304 should be enabled (by closing the feedback switch $Sw_{FB}$) and set to a relatively high resistance state (e.g., by opening most or all of the switches $Sw_{FB1}$-$Sw_{FBn}$ in the multi-state resistance block 310 of FIG. 3B). In addition, appropriate bias levels for the amplification core 301 may be selected to ensure that the input impedance matching meets required specifications for the maximum gain mode.

As another example, for multiple mid-level gain modes requiring high linearity (better IIP3), the degeneration inductor $L_{DEG}'$ generally should be bypassed and the feedback circuit 304 should be enabled and set to a corresponding resistance state (e.g., by opening selected ones of the switches $Sw_{FB1}$-$Sw_{FBn}$ mapped to a particular mid-level gain mode).

As yet another example, for a minimum gain mode requiring high linearity (better IIP3) where a higher noise factor is not a concern, the degeneration inductor $L_{DEG}'$ generally should be bypassed and the feedback circuit 304 should be enabled and set to its lowest resistance state (e.g., by closing all of the switches $Sw_{FB1}$-$Sw_{FBn}$, leaving only the non-switchable resistor $R_{FB0}$ in the feedback signal path).

Figure 2:
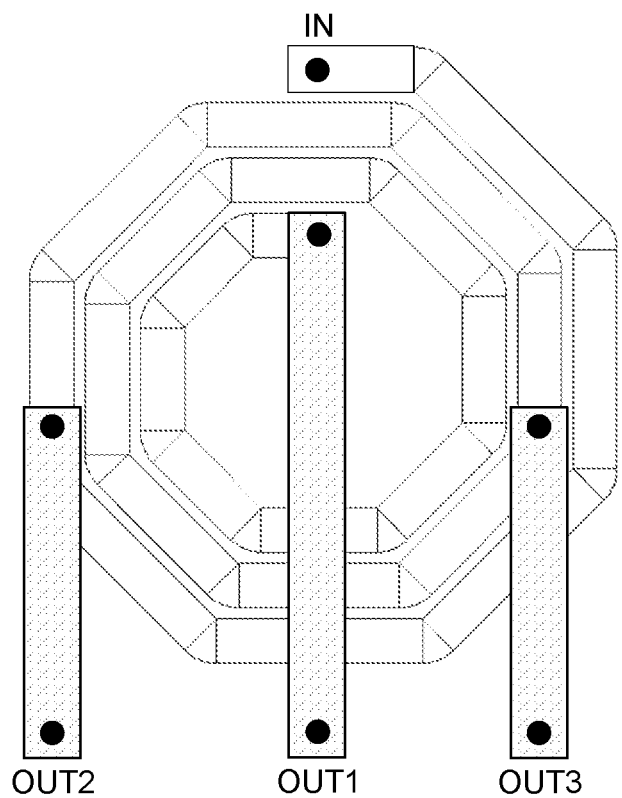
FIG. 2 is a stylized diagram of a prior art integrated circuit inductor coil.
Figure 4:
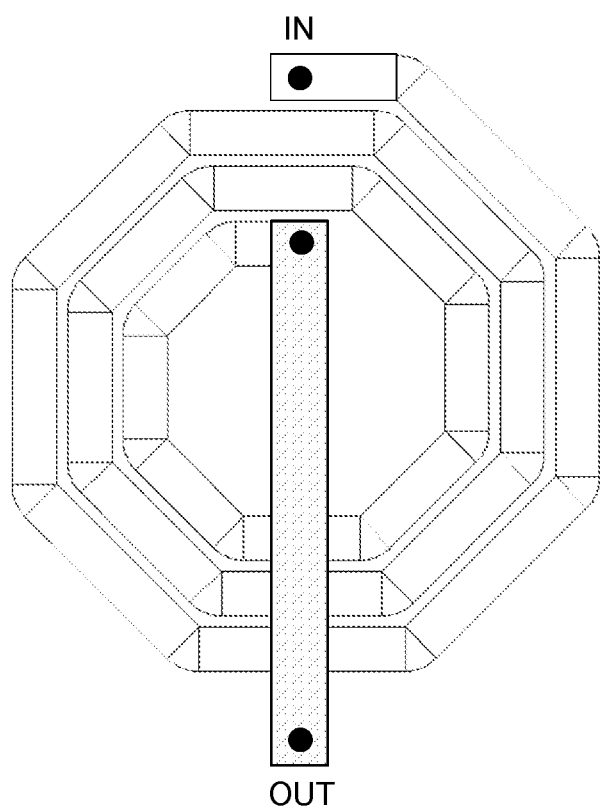
FIG. 4 is a stylized diagram of an integrated circuit inductor coil suitable for use as the degeneration inductor $L_{DEG}'$ in FIG. 3A.

One advantage of the LNA architecture shown in FIG. 3A is that the degeneration inductor $L_{DEG}'$ can be greatly simplified to a non-multiport configuration. For example, FIG. 4 is a stylized diagram of an integrated circuit inductor coil 400 suitable for use as the degeneration inductor $L_{DEG}'$ in FIG. 3A. The inductor coil 400 has an input port IN and only a single output port OUT. The simplified configuration of the inductor coil 400 results in less inductive and capacitive coupling, which would improve the quality factor of the inductor coil 400. The overall inductor value is also reduced—for example, using similar IC design rules in generally similar LNA circuit designs, the total inductance of the inductor coil 400 of FIG. 4 may be less than half of the total inductance of the inductor coil 200 of FIG. 2 in many applications. The simplified configuration also eliminates several switches compared to the prior art multi-port coil 200 shown in FIGS. 1 and 2, thus reducing the IC "real estate" required for the degeneration circuit 302.

With the multiport degeneration inductor $L_{DEG}$ and switch configuration of FIG. 1, in a high-gain mode, a switch is in the signal path, resulting in additional noise. With the inventive architecture, eliminating having any switch in the signal path within the degeneration circuit 302 reduces noise, thereby further increasing the performance of the LNA circuit 300.

Reducing inductive and capacitive coupling provides a new design tradeoff: the inductor coil 400 can be made physically smaller than a prior-art multi-port coil 200 but retain about the same Q value, or can be made about the same size as a prior-art multi-port coil 200 but with an increase in the Q value of the inductor (of course, intermediate sizes can be selected to trade-off between physical size and Q value). IC "real estate" reduction occurs even if the inductor coil 400 is made physically the same size as a prior-art multi-port coil 200, since the necessary output port switches are eliminated. A multi-port coil 200 also increases design complexity and requires more programming to control the switches coupled to the various output ports.

The benefits of the invention include generally better NF in a high-gain mode, generally better IIP3 in a low-gain mode, and IC area saving. As one example of such improvement, TABLE 3 below sets forth measured NF and IIP3 figures for one embodiment of a prior art LNA similar to FIG. 1 versus an embodiment of an LNA similar to FIG. 3A, for a frequency range of 925 MHz to 960 MHz. The highest gain state is "0", while the lowest gain state is "3". For the example embodiment, when in high-gain mode 0, the degeneration circuit 302 is in a non-bypass mode and the feedback circuit 304 disabled. Conversely, when in low-gain mode 3, the degeneration circuit 302 is in a bypass mode and the feedback circuit 304 enabled. For the intermediate modes (high-gain 1 or low-gain 2), the intermediate switch settings shown in TABLE 2 may be used (e.g., Swim, open, $Sw_{FB}$ closed, and $R_{FB}$=R3 or $R_{FB}$=R2).

TABLE 3

| | NF (dB) (lower is better) | | IIP3 (dBm) (higher is better) | |
| --- | --- | --- | --- | --- |
| Gain State | Prior Art | Example Embodiment | Prior Art | Example Embodiment |
| High-gain 0 | 0.96 | 0.92 | −2.7 | −0.12 |
| High-gain 1 | 1.01 | 0.98 | −1.5 | 0.63 |
| Low-gain 2 | 2.54 | 2.62 | 7.3 | 6.42 |
| Low-gain 3 | 9.54 | 9.45 | 6.2 | 9.93 |

Notably, for this example, IIP3 is quite good in the high-gain modes (even though NF is emphasized), and, conversely, NF is quite good in the low-gain modes (even though IIP3 is emphasized). Note that the IIP3 improvement in the high-gain modes is related to the OFF state capacitance, CUFF of the feedback switch $Sw_{FB}$. Although the feedback switch $Sw_{FB}$ is open in at least the highest gain mode, the parasitic capacitance of the feedback switch $Sw_{FB}$ in the OFF state partially keeps the feedback path working. The improved IP3 in high-gain modes may also be related to different choices for the value of the degeneration inductor $L_{DE}G'$ and the overall frequency response of the degeneration circuit 302.

System Aspects

Embodiments of the present invention are useful in a wide variety of larger radio frequency (RF) circuits and systems, such as radar systems (including phased array and automotive radar systems), radio systems (including cellular radio systems), and test equipment.

Radio system usage includes wireless RF systems (including base stations, relay stations, and hand-held transceivers) that use various technologies and protocols, including various types of orthogonal frequency-division multiplexing ("OFDM"), quadrature amplitude modulation ("QAM"), Code-Division Multiple Access ("CDMA"), Time-Division Multiple Access ("TDMA"), Wide Band Code Division Multiple Access ("W-CDMA"), Global System for Mobile Communications ("GSM"), Long Term Evolution ("LTE"), 5G, and WiFi (e.g., 802.11a, b, g, ac, ax), as well as other radio communication standards and protocols.

Figure 5:
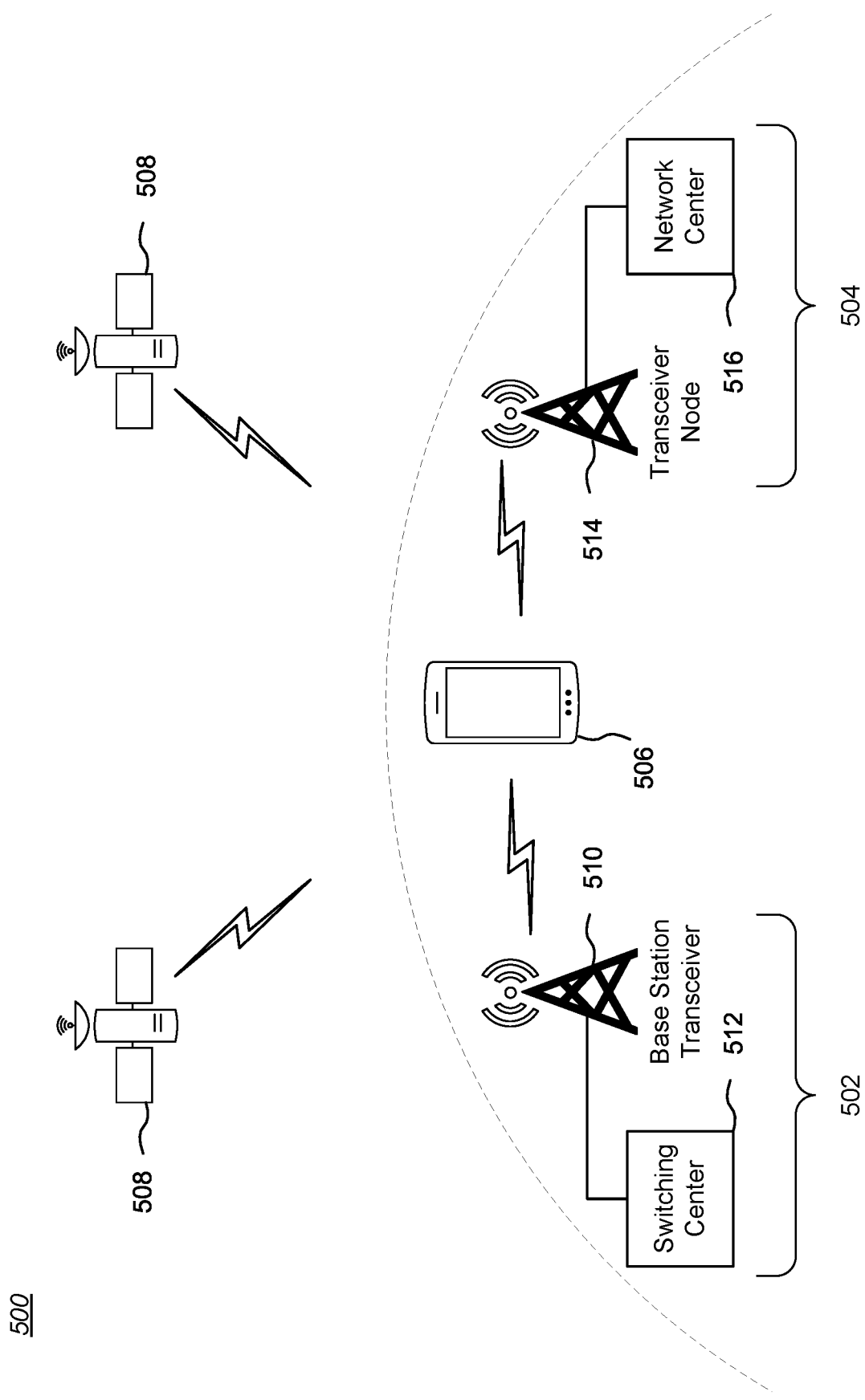
FIG. 5 illustrates an exemplary prior art wireless communication environment comprising different wireless communication systems, and may include one or more mobile wireless devices.

As an example of wireless RF system usage, FIG. 5 illustrates an exemplary prior art wireless communication environment 500 comprising different wireless communication systems 502 and 504, and may include one or more mobile wireless devices 506.

A wireless device 506 may be capable of communicating with multiple wireless communication systems 502, 504 using one or more of the telecommunication protocols noted above. A wireless device 506 also may be capable of communicating with one or more satellites 508, such as navigation satellites (e.g., GPS) and/or telecommunication satellites. The wireless device 506 may be equipped with multiple antennas, externally and/or internally, for operation on different frequencies and/or to provide diversity against deleterious path effects such as fading and multipath interference. A wireless device 506 may be a cellular phone, a personal digital assistant (PDA), a wireless-enabled computer or tablet, or some other wireless communication unit or device. A wireless device 506 may also be referred to as a mobile station, user equipment, an access terminal, or some other terminology.

The wireless system 502 may be, for example, a CDMA-based system that includes one or more base station transceivers (BSTs) 510 and at least one switching center (SC) 512. Each BST 510 provides over-the-air RF communication for wireless devices 506 within its coverage area. The SC 512 couples to one or more BSTs in the wireless system 502 and provides coordination and control for those BSTs.

The wireless system 504 may be, for example, a TDMA-based system that includes one or more transceiver nodes 514 and a network center (NC) 516. Each transceiver node 514 provides over-the-air RF communication for wireless devices 506 within its coverage area. The NC 516 couples to one or more transceiver nodes 514 in the wireless system 504 and provides coordination and control for those transceiver nodes 514.

In general, each BST 510 and transceiver node 514 is a fixed station that provides communication coverage for wireless devices 506, and may also be referred to as base stations or some other terminology. The SC 512 and the NC 516 are network entities that provide coordination and control for the base stations and may also be referred to by other terminologies.

Figure 6:
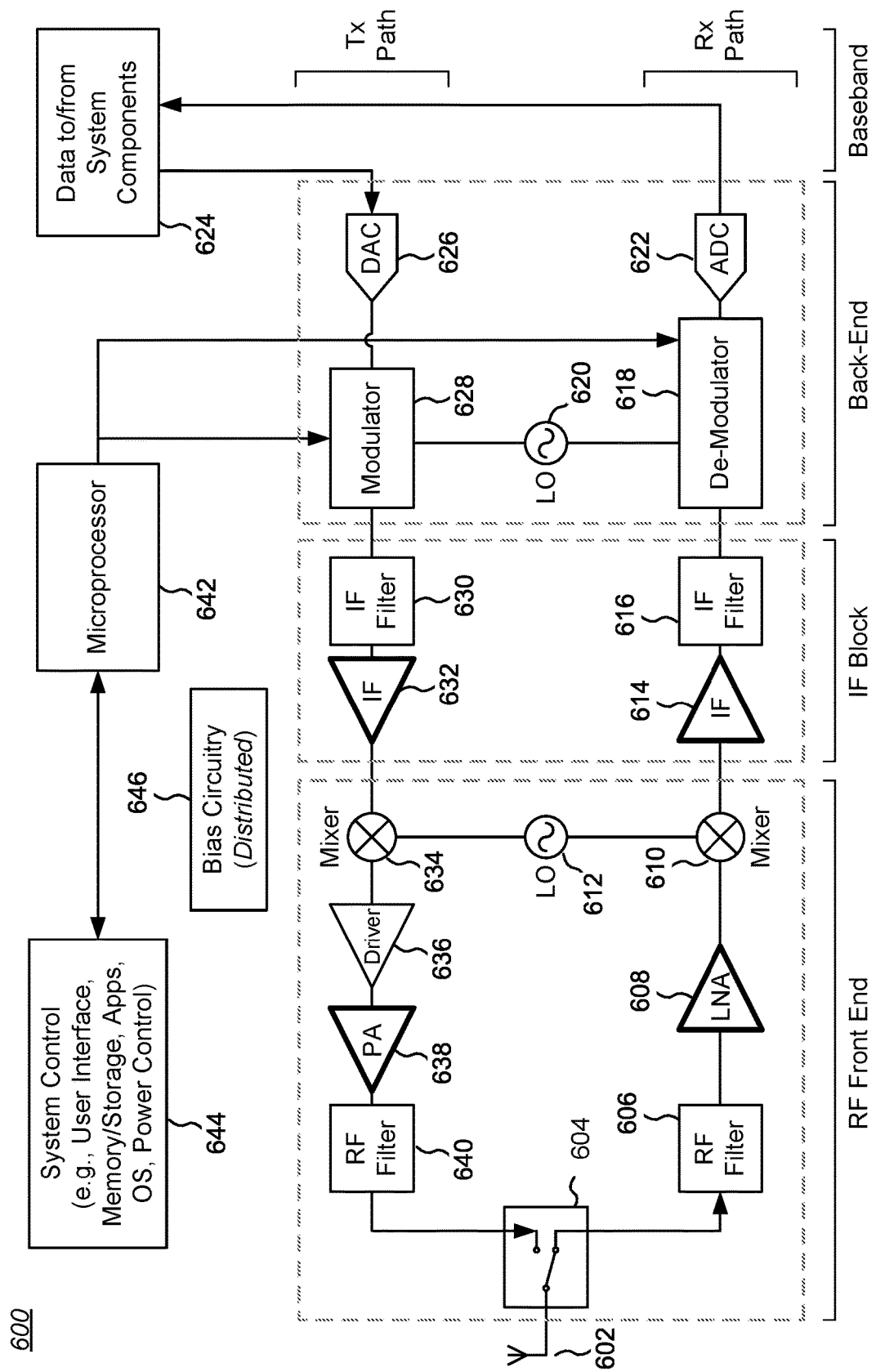
FIG. 6 is a block diagram of a transceiver that might be used in a wireless device, such as a cellular telephone, and which may beneficially incorporate an embodiment of the present invention for improved performance.

An important aspect of any wireless system, including the systems shown in FIG. 5, is in the details of how the component elements of the system perform. FIG. 6 is a block diagram of a transceiver 600 that might be used in a wireless device, such as a cellular telephone, and which may beneficially incorporate an embodiment of the present invention for improved performance. As illustrated, the transceiver 600 includes a mix of RF analog circuitry for directly conveying and/or transforming signals on an RF signal path, non-RF analog circuitry for operational needs outside of the RF signal path (e.g., for bias voltages and switching signals), and digital circuitry for control and user interface requirements. In this example, a receiver path Rx includes RF Front End, IF Block, Back-End, and Baseband sections (noting that in some implementations, the differentiation between sections may be different).

The receiver path Rx receives over-the-air RF signals through an antenna 602 and a switching unit 604, which may be implemented with active switching devices (e.g., field effect transistors or FETs), or with passive devices that implement frequency-domain multiplexing, such as a diplexer or duplexer. An RF filter 606 passes desired received RF signals to a low noise amplifier (LNA) 608, the output of which is combined in a mixer 610 with the output of a first local oscillator 612 to produce an intermediate frequency (IF) signal. The LNA 608 beneficially may be of the type shown in FIG. 3A.

The IF signal may be amplified by an IF amplifier 614 and subjected to an IF filter 616 before being applied to a demodulator 618, which may be coupled to a second local oscillator 620. The IF amplifier 614 beneficially may be of the type shown in FIG. 3A. The demodulated output of the demodulator 618 is transformed to a digital signal by an analog-to-digital converter 622 and provided to one or more system components 624 (e.g., a video graphics circuit, a sound circuit, memory devices, etc.). The converted digital signal may represent, for example, video or still images, sounds, or symbols, such as text or other characters.

In the illustrated example, a transmitter path Tx includes Baseband, Back-End, IF Block, and RF Front End sections (again, in some implementations, the differentiation between sections may be different). Digital data from one or more system components 624 is transformed to an analog signal by a digital-to-analog converter 626, the output of which is applied to a modulator 628, which also may be coupled to the second local oscillator 620. The modulated output of the modulator 628 may be subjected to an IF filter 630 before being amplified by an IF amplifier 632, which beneficially may be of the type shown in FIG. 3A. The output of the IF amplifier 632 is then combined in a mixer 634 with the output of the first local oscillator 612 to produce an RF signal. The RF signal may be amplified by a driver 636, the output of which is applied to a power amplifier (PA) 638, which beneficially may be of the type shown in FIG. 3A. The amplified RF signal may be coupled to an RF filter 640, the output of which is coupled to the antenna 602 through the switching unit 604.

The operation of the transceiver 600 is controlled by a microprocessor 642 in known fashion, which interacts with system control components (e.g., user interfaces, memory/storage devices, application programs, operating system software, power control, etc.). In addition, the transceiver 600 will generally include other circuitry, such as bias circuitry 646 (which may be distributed throughout the transceiver 600 in proximity to transistor devices), electrostatic discharge (ESD) protection circuits, testing circuits (not shown), factory programming interfaces (not shown), etc.

In modern transceivers, there are often more than one receiver path Rx and transmitter path Tx, for example, to accommodate multiple frequencies and/or signaling modalities. Further, as should be apparent to one of ordinary skill in the art, some components of the transceiver 600 may be in a positioned in a different order (e.g., filters) or omitted. Other components can be (and usually are) added (e.g., additional filters, impedance matching networks, variable phase shifters/attenuators, power dividers, etc.).

As a person of ordinary skill in the art will understand, an RF system architecture is beneficially impacted by the current invention in critical ways, including better LNA performance, and, more specifically, improved NF in a high-gain mode and improved IIP3 in a low-gain mode. These system-level improvements are specifically enabled by the current invention and enable embodiments of the invention to meet the strict performance specifications of customers and a number of RF standards. The current invention is therefore critical to the embodiments of the overall system shown in FIG. 6.

Methods

Another aspect of the invention includes methods for gain-tuning an amplifier, particularly a low-noise amplifier.

Figure 7:
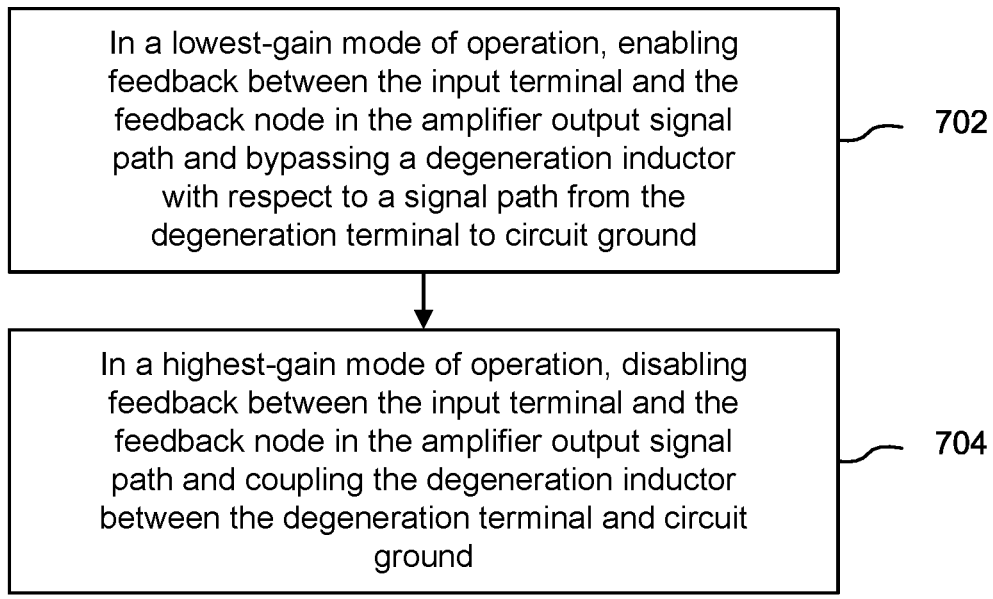
FIG. 7 is a process flow chart showing one method for gain-tuning an amplifier that includes an amplifier core including an input terminal configured to receive a radio-frequency (RF) signal, a degeneration terminal, and a feedback node in an amplifier output signal path.

For example, FIG. 7 is a process flow chart 700 showing one method for gain-tuning an amplifier that includes an amplifier core including an input terminal configured to receive a radio-frequency (RF) signal, a degeneration terminal, and a feedback node in an amplifier output signal path. The method includes: in a lowest-gain mode of operation, enabling feedback between the input terminal and the feedback node in the amplifier output signal path and bypassing a degeneration inductor with respect to a signal path from the degeneration terminal to circuit ground (Block 702); and in a highest-gain mode of operation, disabling feedback between the input terminal and the feedback node in the amplifier output signal path and coupling the degeneration inductor between the degeneration terminal and circuit ground (Block 704)

Additional aspects of the above method may include one or more of the following: wherein in a low-gain mode of operation different from the lowest-gain mode of operation, enabling feedback between the input terminal and the feedback node in the amplifier output signal path and coupling the degeneration inductor between the degeneration terminal and circuit ground; wherein in a high-gain mode of operation different from the highest-gain mode of operation, enabling feedback between the input terminal and the feedback node in the amplifier output signal path and coupling the degeneration inductor between the degeneration terminal and circuit ground; wherein the feedback is from a feedback circuit that includes a resistor, a capacitor, and a switch coupled in series; wherein the degeneration inductor is a two-port coiled integrated circuit inductor; wherein the low-noise amplifier further includes an impedance matching circuit coupled to the input terminal and configured to receive the RF signal; wherein the low-noise amplifier further includes a load matching and bias feed circuit coupled to the amplified-signal terminal; and/or wherein the low-noise amplifier further includes a bias circuit coupled to the amplifier core.

Fabrication Technologies & Options

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

With respect to the figures referenced in this disclosure, the dimensions for the various elements are not to scale; some dimensions have been greatly exaggerated vertically and/or horizontally for clarity or emphasis. In addition, references to orientations and directions (e.g., "top", "bottom", "lower", "upper", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS transistor devices, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), particularly ICs based on MOSFET switching devices manufactured in a silicon-on-insulator (SOI) process, which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. An amplifier including:
   (a) an amplifier core including:
      (1) at least two FETs coupled in a stacked arrangement;
      (2) an input terminal configured to receive a radio-frequency (RF) signal and coupled to a first FET of the at least two FETs;
      (3) a degeneration terminal coupled to the first FET of the at least two FETs;
      (4) an amplified-signal terminal coupled to a second FET of the at least two FETs; and
      (5) a feedback node in an output signal path of the amplifier core and coupled to at least one FET of the at least two FETs;
   (b) a degeneration circuit coupled between the degeneration terminal and circuit ground, the generation circuit including:
      (1) a degeneration inductance; and
      (2) a bypass switch coupled in parallel with the degeneration inductance; and
   (c) a feedback circuit coupled between the input terminal and the feedback node through a feedback switch, the feedback circuit being selectively enabled by closing the feedback switch, and selectively disabled by opening the feedback switch;
   wherein in a first low gain mode of operation, the feedback circuit is enabled and the bypass switch is in a closed state, bypassing the degeneration inductance, thereby removing the degeneration inductance from between the degeneration terminal and circuit ground; and
   wherein in a first high gain mode of operation, the feedback circuit is disabled and the bypass switch is in an open state, thereby coupling the degeneration terminal to circuit ground through the degeneration inductance.

2. The invention of claim 1, wherein in a low-gain mode of operation different from the first low gain mode of operation, the feedback circuit is enabled and the bypass switch is in an open state.

3. The invention of claim 1, wherein in a high-gain mode of operation different from the first high gain mode of operation, the feedback circuit is enabled and the bypass switch is in an open state.

4. The invention of claim 1, wherein the amplifier is a low-noise amplifier.

5. The invention of claim 1, wherein the feedback circuit includes a resistor, a capacitor, and the feedback switch coupled in series.

6. The invention of claim 1, wherein the degeneration inductance is a two-port coiled integrated circuit inductor.

7. The invention of claim 1, further including an impedance matching circuit coupled to the input terminal and configured to receive the RF signal.

8. The invention of claim 1, further including a load matching and bias feed circuit coupled to the amplified-signal terminal.

9. The invention of claim 1, further including a bias circuit coupled to the amplifier core.

10. The invention of claim 1, wherein the amplifier is implemented as an integrated circuit fabricated in a silicon-on-insulator technology and includes MOS devices.

11. The invention of claim 1, wherein the amplifier is implemented as an integrated circuit comprising part of a communications receiver or transmitter or transceiver.

12. A low-noise amplifier including:
   (a) a common-source FET having a gate configured to receive an input radio-frequency (RF) signal, a source, and a drain;
   (b) at least one common-gate FET, each having a gate, a source, and a drain outputting an amplified version of the input RF signal, wherein the source of one of the at least one common-gate FET is coupled to the drain of the common-source FET;
   (c) a degeneration circuit coupled between the source of the common-source FET and circuit ground, the generation circuit including:
      (1) a degeneration inductance; and
      (2) a bypass switch coupled in parallel with the degeneration inductance;
   (d) a feedback circuit coupled through a feedback switch between the gate of the common-source FET and the drain of one of the at least one common-gate FET or of the common source FET, the feedback circuit being selectively enabled by closing the feedback switch, and selectively disabled by opening the feedback switch;
   wherein in a first low gain mode of operation, the feedback circuit is enabled and the bypass switch is in a closed state, bypassing the degeneration inductance, thereby removing the degeneration inductance from between the degeneration terminal and circuit ground; and
   wherein in a first high gain mode of operation, the feedback circuit is disabled and the bypass switch is in an open state, thereby coupling the degeneration terminal to circuit ground through the degeneration inductance.

13. The invention of claim 12, wherein in a low-gain mode of operation different from the first low gain mode of operation, the feedback circuit is enabled and the bypass switch is in an open state.

14. The invention of claim 12, wherein in a high-gain mode of operation different from the first high gain mode of operation, the feedback circuit is enabled and the bypass switch is in an open state.

15. The invention of claim 12, wherein the feedback circuit includes a resistor, a capacitor, and the feedback switch coupled in series.

16. The invention of claim 12, wherein the degeneration inductance is a two-port coiled integrated circuit inductor.

17. The invention of claim 12, further including an impedance matching circuit coupled to the gate of the common-source FET and configured to receive the RF signal.

18. The invention of claim 12, further including a load matching and bias feed circuit coupled to the drain of the common-gate FET.

19. The invention of claim 12, further including a bias circuit coupled to the gate of the common-source FET and to the gate of the common-gate FET.

20. The invention of claim 12, wherein the low-noise amplifier is implemented as an integrated circuit fabricated in a silicon-on-insulator technology and includes MOS devices.

21. The invention of claim 12, wherein the low-noise amplifier is implemented as an integrated circuit comprising part of a communications receiver or transmitter or transceiver.

* * * * *